(12) United States Patent
Hwang et al.

(10) Patent No.: US 9,786,590 B2
(45) Date of Patent: Oct. 10, 2017

(54) SEMICONDUCTOR PACKAGE INCLUDING A CONDUCTIVE FABRIC

(71) Applicant: SK Hynix Inc., Icheon-si, Gyeonggi-do (KR)

(72) Inventors: In Chul Hwang, Seoul (KR); Ki Young Kim, Seongnam-si (KR); Myung Geun Park, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/070,184

(22) Filed: Mar. 15, 2016

(65) Prior Publication Data

US 2017/0179003 A1    Jun. 22, 2017

(30) Foreign Application Priority Data

Dec. 22, 2015    (KR) .................. 10-2015-0184172

(51) Int. Cl.
| | | |
|---|---|---|
| *H01L 23/48* | (2006.01) | |
| *H01L 23/52* | (2006.01) | |
| *H01L 29/40* | (2006.01) | |
| *H01L 23/498* | (2006.01) | |
| *H01L 23/00* | (2006.01) | |
| *H05K 1/11* | (2006.01) | |

(52) U.S. Cl.
CPC .... *H01L 23/4985* (2013.01); *H01L 23/49838* (2013.01); *H01L 23/49894* (2013.01); *H01L 24/17* (2013.01); *H05K 1/111* (2013.01); *H01L 2224/17104* (2013.01)

(58) Field of Classification Search
CPC . H01L 2224/32225; H01L 2224/16225; H01L 2224/73204; H01L 2224/48227; H01L 2224/73253; H01L 2224/73265; H01L 2224/2919; H01L 2924/014; H01L 2224/29199; H01L 2224/17104; H01L 23/49838; H01L 23/4985; H01L 23/49894; H01L 24/17; H05K 1/111
USPC .............................................. 257/737
See application file for complete search history.

(56) References Cited

U.S. PATENT DOCUMENTS

| | | | |
|---|---|---|---|
| 4,954,873 A | 9/1990 | Lee et al. | |
| 2003/0102225 A1* | 6/2003 | Kim ............. | D06M 11/83 205/160 |
| 2003/0119391 A1* | 6/2003 | Swallow .......... | D02G 3/38 442/6 |
| 2009/0152257 A1* | 6/2009 | Cheng ........... | H05B 3/342 219/201 |
| 2011/0084386 A1* | 4/2011 | Pendse .......... | H01L 23/3178 257/737 |

(Continued)

FOREIGN PATENT DOCUMENTS

| | | |
|---|---|---|
| JP | 2003287558 | * 10/2003 |
| KR | 2020100000680 U | 1/2010 |

*Primary Examiner* — Duy T Nguyen
(74) *Attorney, Agent, or Firm* — William Park & Associates Ltd.

(57) ABSTRACT

A semiconductor package may be provided. The semiconductor package may include a substrate formed with one or more connection pads. The semiconductor package may include a semiconductor device including at least one bump. The semiconductor package may include an anisotropic conductive fabric including conductive fibers and configured to electrically couple the at least one connection pad to the at least one bump.

24 Claims, 8 Drawing Sheets

(56) References Cited

U.S. PATENT DOCUMENTS

2014/0102755 A1* 4/2014 Adriaenssens ..... H01B 11/1895
  174/113 R

* cited by examiner

SEMICONDUCTOR PACKAGE INCLUDING A CONDUCTIVE FABRIC

CROSS-REFERENCE TO RELATED APPLICATION

The present application claims priority under 35 U.S.C. §119(a) to Korean Patent Application No. 10-2015-0184172 filed in the Korean Intellectual Property Office on Dec. 22, 2015, which is incorporated herein by reference in its entirety.

BACKGROUND

1. Technical Field

Various embodiments generally relate to a semiconductor technology, and more particularly, to a semiconductor package including a conductive fabric.

2. Related Art

These days, the trend of the electronic industry is to manufacture products at reduced costs. The manufactured products require high reliability and are designed to be light weight, miniaturized, operate with high speeds, multi-functional and to have a high performance. Package assembly technology is considered as one of the more important technologies for achieving these manufactured products.

SUMMARY

According to an embodiment, a semiconductor package may be provided. The semiconductor package may include a substrate formed with one or more connection pads on one surface thereof. The semiconductor package may include an anisotropic conductive fabric woven by using conductive fibers as wefts and using insulative fibers as warps, and attached to the connection pads and the one surface of the substrate such that at least one of the conductive fibers is electrically connected to each connection pad of the substrate. The semiconductor package may include a semiconductor device including one or more bumps, and bonded to the anisotropic conductive fabric by the medium of the bumps such that each bump is electrically connected to at least one conductive fiber at a position turned aside from each connection pad.

DETAILED DESCRIPTION

Hereinafter, a semiconductor package may be described below with reference to the accompanying drawings through various examples of embodiments.

Figure 1:
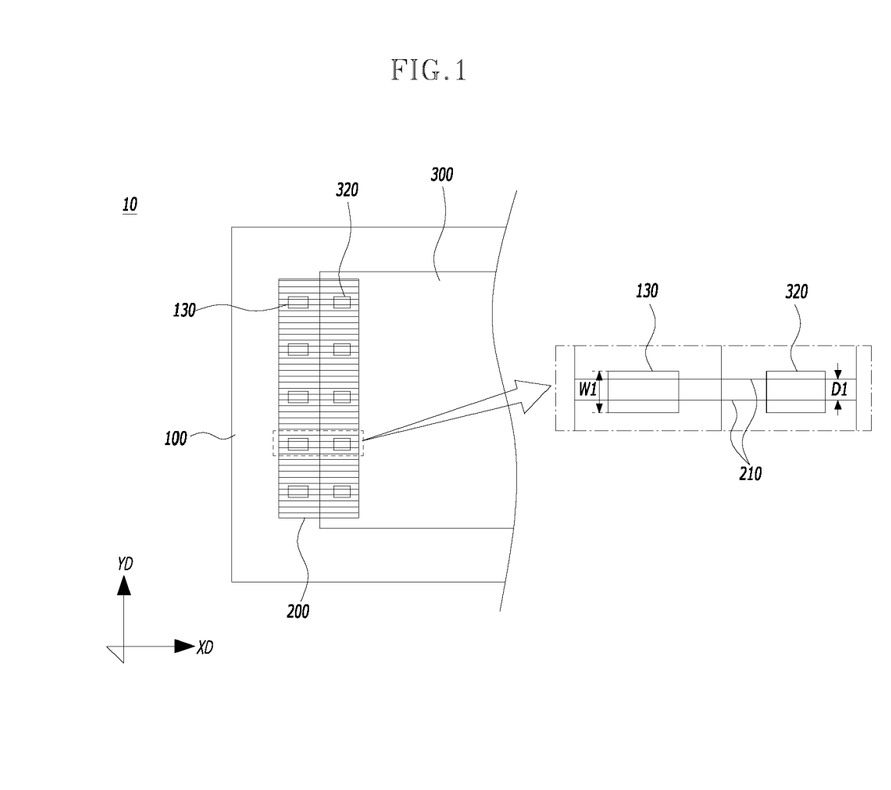
FIG. 1 is a top view illustrating a representation of an example of a semiconductor package in accordance with an embodiment.
Figure 2:
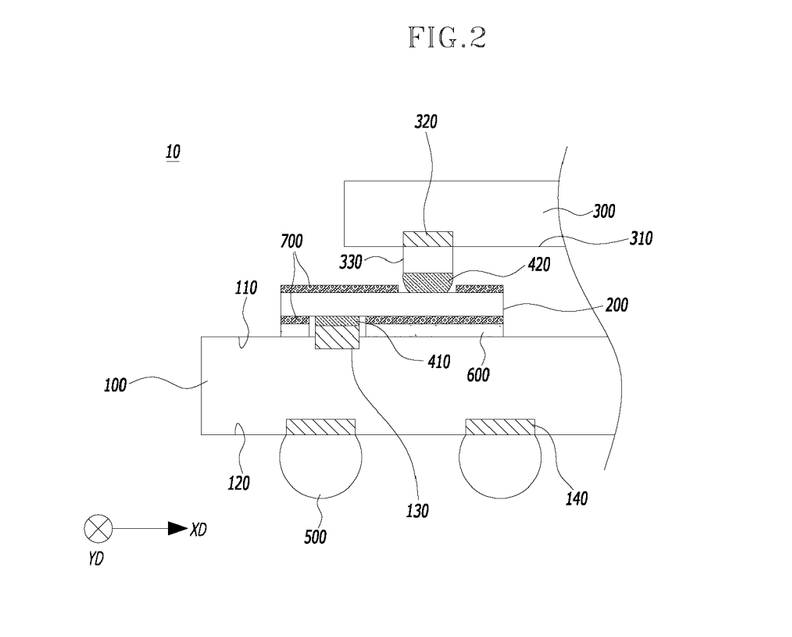
FIG. 2 is a cross-sectional view illustrating a representation of an example of a portion of the semiconductor package illustrated in FIG. 1.

Referring to FIGS. 1 and 2, a semiconductor package 10 in accordance with an embodiment may include a substrate 100, an anisotropic conductive fabric 200, and a semiconductor device 300. The semiconductor package 10 in accordance with an embodiment may include first conductive connection members 410 and second conductive connection members 420. The substrate 100 may be a flexible substrate. The substrate 100 may have one surface 110 and the other surface 120 which faces away from the one surface 110, and may include one or more connection pads 130 on the one surface 110. In an embodiment, the substrate 100 may include a plurality of connection pads 130 which are arranged in a Y direction YD defined in FIG. 1. Referring to FIG. 1, the reference symbol XD represents an X direction that is perpendicular to the Y direction YD.

The substrate 100 may include a plurality of electrode pads 140 on the other surface 120. The substrate 100 may include circuit wiring lines (not illustrated) which electrically connect the connection pads 130 formed on the one surface 110 and the electrode pads 140 formed on the other surface 120, and external connection electrodes 500 such as solder balls may be formed on the electrode pads 140.

Although it is illustrated in an embodiment referring to FIGS. 1 and 2 that the substrate 100 is a flexible substrate, it is to be noted that the substrate 100 may be any one selected among a module substrate, a package substrate, a main board substrate and an interposer.

Figure 3:
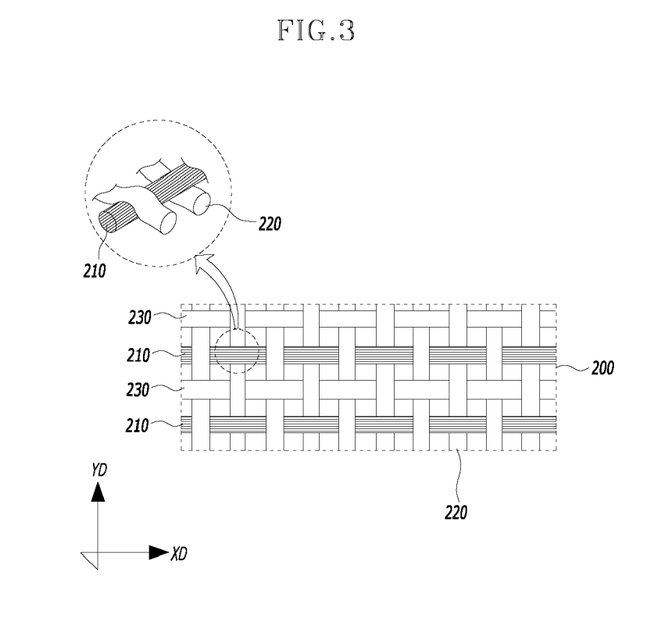
FIG. 3 is a view illustrating a representation of an example of a portion of an anisotropic conductive fabric in accordance with an embodiment.

Referring to FIG. 3, the anisotropic conductive fabric 200 may be woven by supplying conductive fibers 210 as wefts and supplying insulative fibers 220 as warps, to a weaving machine. The wefts mean fibers which are disposed in the X direction XD defined in FIG. 3, and the warps mean fibers which are interlaced with the wefts in a direction perpendicular to the wefts, that is, in the Y direction YD defined in FIG. 3.

Hereinbelow, for the sake of convenience in explanation, the X direction XD will be defined as a weft direction, and the Y direction YD will be defined as a warp direction.

The conductive fibers 210 are separated from one another by the structure of the anisotropic conductive fabric 200 itself, and accordingly, conductive paths may be defined in the anisotropic conductive fabric 200 by the number of the conductive fibers 210.

The conductive fibers 210 may be constructed by metal yarns including copper, silver, gold, stainless steel, etc. or conductive polymer yarns with contractibility. The insulative fibers 220 may be constructed by insulative polymer yarns with contractibility, such as nylon and polyester. The insulative fibers 220 may serve to impart flexibility to the anisotropic conductive fabric 200 in the warp direction YD to absorb an external force or a shock applied to the anisotropic conductive fabric 200, and increase the stiffness of the anisotropic conductive fabric 200.

Reinforcing insulative yarns 230 as wefts may be added between the conductive fibers 210 of the anisotropic conductive fabric 200. In the same manner as the insulative fibers 220 used as the warps, the reinforcing insulative yarns 230 may be constructed by insulative polymer yarns with contractibility, such as nylon and polyester. As the reinforcing insulative yarns 230 as wefts are added to the anisotropic conductive fabric 200, flexibility may be imparted to the anisotropic conductive fabric 200 in not only the warp direction YD but also the weft direction XD, whereby the shock-absorbing function and the stiffness of the anisotropic conductive fabric 200 may be improved. Moreover, even when an external force is applied to the anisotropic conductive fabric 200 and the shape of the anisotropic conductive fabric 200 is changed, the reinforcing insulative yarns 230 may prevent the conductive fibers 210 from being brought into contact with one another and prevent the conductive fibers 210 from short-circuiting.

Referring again to FIGS. 1 and 2, the anisotropic conductive fabric 200 may be attached to the connection pads 130 and the one surface 110 of the substrate 100 in such a manner that the conductive fibers 210 traverse the connection pads 130 in a direction crossing with a direction in which the connection pads 130 are arranged.

In an embodiment illustrated in FIGS. 1 and 2, the connection pads 130 may be arranged in the warp direction YD defined in FIG. 1, and the anisotropic conductive fabric 200 may be attached to the one surface 110 of the substrate 100 in such a manner that the conductive fibers 210 traverse the connection pads 130 in the weft direction XD.

In order to provide a conductive path which is connected to each connection pad 130, at least one conductive fiber 210 need be disposed on each connection pad 130. To this end, the anisotropic conductive fabric 200 may be woven in such a manner that the interval between the conductive fibers 210 is smaller than the width of each connection pad 130 in the warp direction YD. That is to say, when the interval between the conductive fibers 210 is D1 and the width of each connection pad 130 in the warp direction YD is W1, the relationship of D1<W1 may be satisfied. In an embodiment, a width of a conductive fiber 210 in a warp direction YD may be less than a width W1 of a connection pad 130 in the warp direction YD.

The anisotropic conductive fabric 200 may be attached to the one surface 110 of the substrate 100 by the medium of an adhesive member 600. The adhesive member 600 may be formed between the bottom surface of the anisotropic conductive fabric 200 and the one surface 110 of the substrate 100, and may attach the anisotropic conductive fabric 200 and the substrate 100 to each other. The adhesive member 600 may have openings that expose the connection pads 130, in order for electrical connection between the connection pads 130 and the conductive fibers 210 of the anisotropic conductive fabric 200.

Protective layers 700 may be formed on the bottom surface and the top surface of the anisotropic conductive fabric 200. The protective layers 700 may be formed of an insulative material. For example, an enamel-coated material may be used as the protective layers 700. The protective layers 700 for preventing the conductive fibers 210 of the anisotropic conductive fabric 200 from undesirably short-circuiting with the substrate 100 and the semiconductor device 300 may have a plurality of openings, in order for electrical connection between the connection pads 130 and the conductive fibers 210 of the anisotropic conductive fabric 200 and electrical connection between the conductive fibers 210 of the anisotropic conductive fabric 200 and bumps 330 which will be described later.

While not illustrated, an adhesive member may not be separately formed between the anisotropic conductive fabric 200 and the substrate 100, and instead, in order to attach the anisotropic conductive fabric 200 to the substrate 100, the protective layer 700 formed on the bottom surface of the anisotropic conductive fabric 200 may be formed of a material which has an adhesion property.

The first conductive connection members 410 may be formed between the connection pads 130 of the substrate 100 and the anisotropic conductive fabric 200, and may electrically connect the connection pads 130 of the substrate 100 and the conductive fibers 210 of the anisotropic conductive fabric 200. Each of the connection pads 130 may be electrically connected to at least one of the conductive fibers 210 of the anisotropic conductive fabric 200 by each of the first conductive connection members 410.

For example, a solder may be used for the material of the first conductive connection members 410.

The first conductive connection members 410 may be formed by, for example, attaching the anisotropic conductive fabric 200 to the connection pads 130 and a portion of the one surface 110 of the substrate 100, disposing a solder on the anisotropic conductive fabric 200 over the connection pads 130, fusing the solder such that fused solder passes between the fibers of the anisotropic conductive fabric 200 and moves to between the connection pads 130 and the anisotropic conductive fabric 200, and then hardening the fused solder. While not illustrated, portions of the fused solder may be hardened in a state in which they permeate into the anisotropic conductive fabric 200 on the connection pads 130, and accordingly, portions of the first conductive connection members 410 may be impregnated into the anisotropic conductive fabric 200.

The semiconductor device 300 may include one or more bonding pads 320 on a front surface 310 thereof. The semiconductor device 300 may include a circuit unit (not illustrated) configured by an integrated circuit in which individual elements such as transistors, resistors, capacitors, fuses and the likes necessary for the operation of the semiconductor device 300 are electrically interconnected, and the bonding pads 320 as external contacts of the circuit unit for electrical connection with an exterior may be electrically connected with the circuit unit. The semiconductor device 300 may include, for example but not limited to, any one selected among an image sensor, a memory semiconductor, a system semiconductor, a passive element, an active element and a sensor semiconductor.

The semiconductor device 300 may include one or more bumps 330 which are electrically connected with the bonding pads 320, on the front surface 310 on which the bonding pads 320 are disposed. The semiconductor device 300 may be bonded to the anisotropic conductive fabric 200 by the medium of the bumps 330 in such a manner that the bumps 330 are electrically connected with the conductive fibers 210 of the anisotropic conductive fabric 200. The semiconductor device 300 may be disposed in a state in which the bumps 330 are not matched in position with the connection pads 130 of the substrate 100 and instead turn aside from the connection pads 130 of the substrate 100 in the weft direction XD. In an embodiment, the semiconductor device 300 may be disposed in a state in which the bumps 330 are not matched in position with the connection pads 130 of the substrate 100 or the bumps 330 are not vertically aligned with the connection pads and instead are horizontally displaced from the connection pads 130 of the substrate 100 in the weft direction XD.

The second conductive connection members 420 may be formed between the anisotropic conductive fabric 200 and the bumps 330 of the semiconductor device 300, and may electrically interconnect the conductive fibers 210 of the anisotropic conductive fabric 200 and the bumps 330. For example, a solder may be used for the material of the second conductive connection members 420.

The second conductive connection members 420 may be formed by, for example, forming a solder on the bumps 330, disposing the semiconductor device 300 on the anisotropic conductive fabric 200 such that the solder faces the anisotropic conductive fabric 200, and then fusing and hardening the solder. While not illustrated, portions of the fused solder may be hardened in a state in which they permeate into the anisotropic conductive fabric 200 under the bumps 330, and accordingly, portions of the second conductive connection members 420 may be impregnated into the anisotropic conductive fabric 200.

In order to stably secure the flexibility of the anisotropic conductive fabric 200, the conductive fibers 210 provided as the wefts may be formed to have a structure with contractibility. Examples of such a structure of the conductive fibers 210 are illustrated in FIGS. 4A to 4C.

Figure 4A:
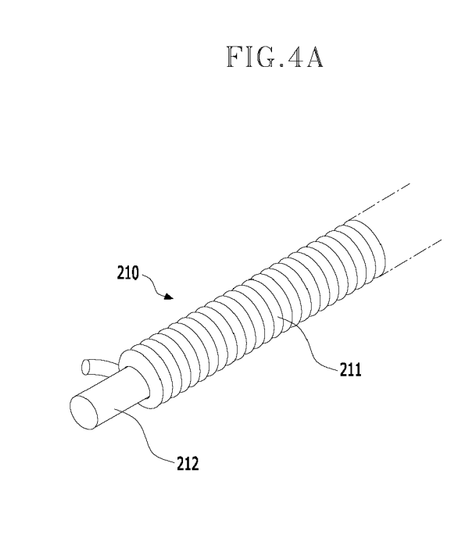
FIGS. 4A to 4C are perspective views illustrating representations of examples of conductive fibers applied to the anisotropic conductive fabric in accordance with an embodiment.

Referring to FIG. 4A, each conductive fiber 210 may have a structure which includes a conductive yarn 211 wound in the form of a coil in a lengthwise direction of the each conductive fiber and a central yarn 212 disposed centrally inside the conductive yarn 211. The central yarn 212 may be constructed by a linear material with contractibility, for example, an insulative polymer yarn with contractibility, such as nylon and polyester.

Figure 4B:
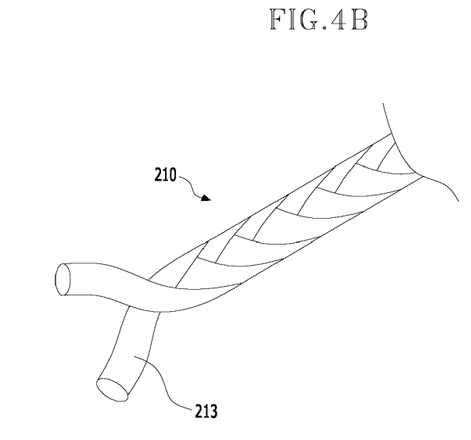
Figure 4C:
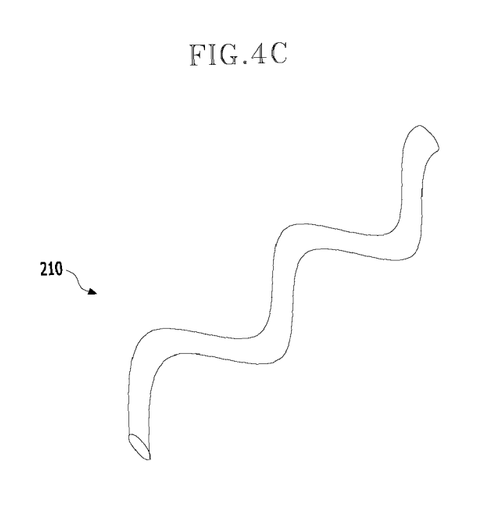

Referring to FIG. 4B, each conductive fiber 210 may be constructed in a shape in which at least two conductive yarns 213 are twisted each other while not having a central yarn. Referring to FIG. 4C, each conductive fiber 210 may be constructed to have a cyclic waveform structure in a lengthwise direction so as to have contractibility against an external force applied in the lengthwise direction. The waveform structure may have the form of, for example, a sine wave, a pulse wave or a sawtooth wave, etc.

Figure 5:
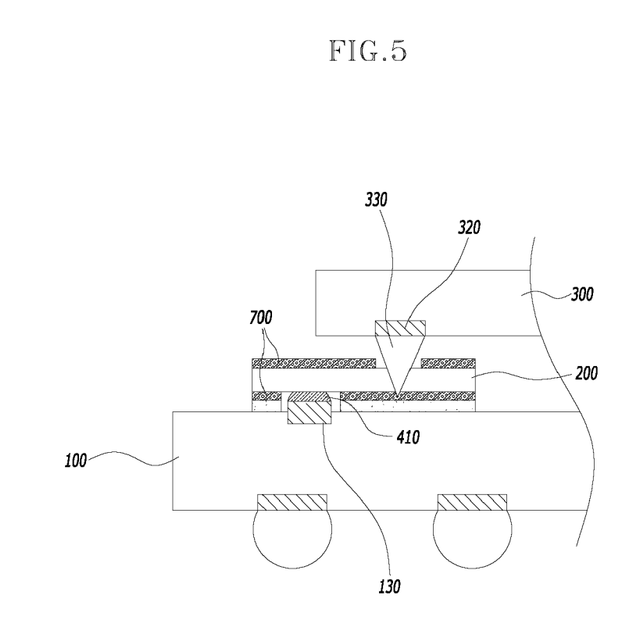
FIG. 5 is a cross-sectional view illustrating a representation of an example of a portion of the semiconductor package in accordance with an embodiment.

While it was explained in an embodiment described above with reference to FIG. 2 that the bumps 330 of the semiconductor device 300 have the shape of a pillar and are connected to the anisotropic conductive fabric 200 through the second conductive connection members 420 instead of being directly connected to the anisotropic conductive fabric 200, it is to be noted that the disclosure is not limited to such. For example, as illustrated in FIG. 5, the bumps 330 may have a wedge shape with a pointed end or substantially a pointed end, and may be directly connected to the anisotropic conductive fabric 200 by being inserted into the anisotropic conductive fabric 200.

According to an above-described embodiment, since an interconnection part between a substrate and a semiconductor device has flexibility and sufficient stiffness, it may be possible to prevent occurrence of an interconnection fail in which the substrate and the semiconductor device are not properly interconnected, even though a warpage occurs in the substrate or/and the semiconductor device due to thermal and physical stresses, whereby reliability and durability may be improved.

Moreover, since portions which enable bump bonding of the semiconductor device are not locally limited and are widely distributed over conductive fibers of an anisotropic conductive fabric, an alignment margin may be increased when mounting the semiconductor device.

The above-described semiconductor packages may be applied to various semiconductor devices and package modules.

Figure 6:
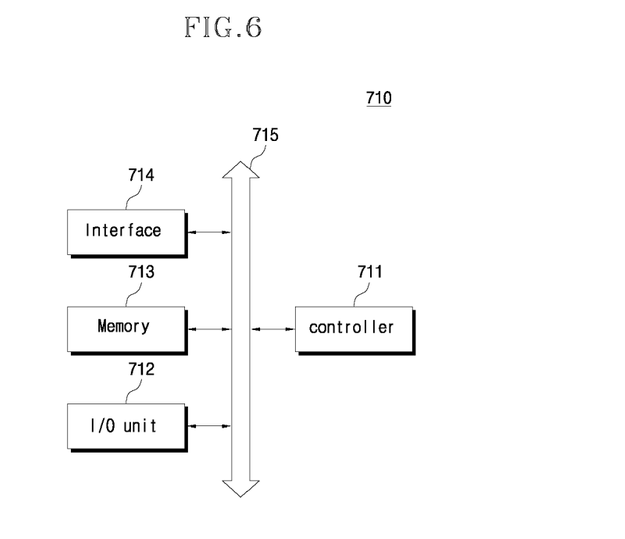
FIG. 6 is a block diagram illustrating a representation of an example of an electronic system including the semiconductor package in accordance with an embodiment.

Referring to FIG. 6, the semiconductor package in accordance with the embodiments (i.e., see FIGS. 1-5 and associated paragraphs) may be applied to an electronic system 710. The electronic system 710 may include a controller 711, an input/output unit 712, and a memory 713. The controller 711, the input/output unit 712 and the memory 713 may be electrically coupled with one another through a bus 715 which provides a data movement path.

For example, the controller 711 may include at least one microprocessor, at least one digital signal processor, at least one microcontroller, and at least one of logic circuits capable of performing the same functions as these components. The memory 713 may include the semiconductor package in accordance with an embodiment. The input/output unit 712 may include at least one selected among a keypad, a keyboard, a display device, a touch screen, and so forth. The memory 713 as a device for storing data may store data or/and commands to be executed by the controller 711 or the like.

The memory 713 may include a volatile memory device such as a DRAM or/and a nonvolatile memory device such as a flash memory. For example, a flash memory may be mounted to an information processing system such as a mobile terminal or a desk top computer. The flash memory may be configured as a solid state drive (SSD). In this case, the electronic system 710 may stably store a large amount of data in a flash memory system.

The electronic system 710 may further include an interface 714 which is set to be able to transmit and receive data to and from a communication network. The interface 714 may be a wired or wireless type. For example, the interface 714 may include an antenna, a wired transceiver or a wireless transceiver.

The electronic system 710 may be understood as a mobile system, a personal computer, a computer for an industrial use or a logic system which performs various functions. For example, the mobile system may be any one among a personal digital assistant (PDA), a portable computer, a tablet computer, a mobile phone, a smart phone, a wireless phone, a laptop computer, a memory card, a digital music system and an information transmission/reception system.

In the case where the electronic system 710 is a device capable of performing wireless communication, the electronic system 710 may be used in a communication system, for example but not limited to, CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 7:
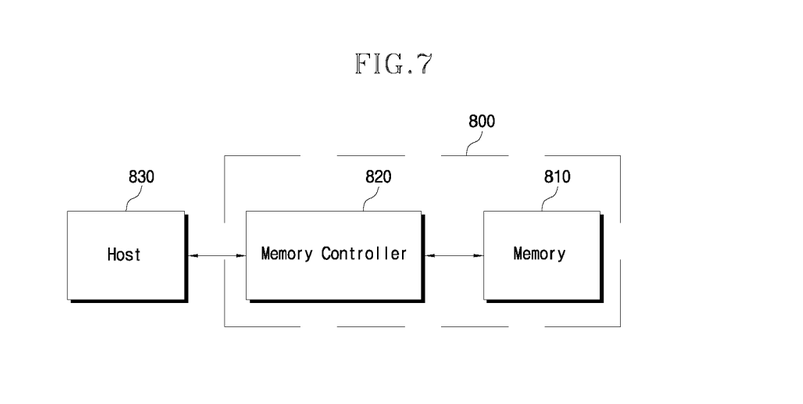
FIG. 7 is a block diagram illustrating a representation of an example of a memory card including the semiconductor package in accordance with an embodiment.

Referring to FIG. 7, the semiconductor package in accordance with an embodiment (i.e., see FIGS. 1-6 and associated paragraphs) may be provided in the form of a memory card 800. For example, the memory card 800 may include a memory 810 such a nonvolatile memory device and a memory controller 820. The memory 810 and the memory controller 820 may store data or read stored data.

The memory 810 may include at least any one among nonvolatile memory devices to which the semiconductor package in accordance with an embodiment is applied, and the memory controller 820 may control the memory 810 to read stored data or store data, in response to a read/write request from a host 830.

While various embodiments have been described above, it will be understood to those skilled in the art that the embodiments described are by way of example only. Accordingly, the semiconductor package described herein should not be limited based on the described embodiments.

What is claimed is:

1. A semiconductor package comprising:
a substrate formed with connection pads on one surface thereof;
an anisotropic conductive fabric including conductive fibers and insulative fibers, and attached to the connection pads and the one surface of the substrate such that at least one of the conductive fibers is electrically coupled to each connection pad of the substrate;
a semiconductor device including bumps, and bonded to the anisotropic conductive fabric by the medium of the bumps such that each bump is electrically connected to at least one conductive fiber at a position horizontally displaced from each connection pad; and
first conductive connection members impregnated into the anisotropic conductive fabric and electrically connecting the connection pads and the conductive fibers of the anisotropic conductive fabric.

2. The semiconductor package according to claim 1, wherein the insulative fibers comprise insulative yarns with contractibility.

3. The semiconductor package according to claim 1, wherein the insulative fibers comprise at least one of either nylon or polyester.

4. The semiconductor package according to claim 1, wherein the anisotropic conductive fabric includes reinforcing insulative yarns which are interlaced with the insulative fibers between the conductive fibers.

5. The semiconductor package according to claim 4, wherein the reinforcing insulative yarns comprise at least one of either nylon or polyester.

6. The semiconductor package according to claim 1, wherein the conductive fibers are constructed to have contractibility.

7. The semiconductor package according to claim 6, wherein the conductive fibers comprise conductive polymer yarns with contractibility.

8. The semiconductor package according to claim 6, wherein each conductive fiber comprises:
at least one conductive yarn wound in the form of a coil in a lengthwise direction of the each conductive fiber; and
a central yarn positioned within the coil of the conductive yarn.

9. The semiconductor package according to claim 8, wherein the central yarn comprises an insulative polymer yarn with contractibility.

10. The semiconductor package according to claim 6, wherein each conductive fiber comprises at least two conductive yarns which are twisted together.

11. The semiconductor package according to claim 6, wherein each conductive fiber is constructed to have a cyclic waveform structure in a lengthwise direction thereof.

12. The semiconductor package according to claim 1,
wherein the anisotropic conductive fabric is woven by using the conductive fibers as wefts and using the insulative fibers as warps, and
wherein the anisotropic conductive fabric is constructed such that an interval between the conductive fibers is less than a width of each connection pad in a direction of the warps.

13. The semiconductor package according to claim 1,
wherein the anisotropic conductive fabric is woven by using the conductive fibers as wefts and using the insulative fibers as warps, and
wherein the width of each conductive fiber is less than a width of each connection pad in a direction of the warps.

14. The semiconductor package according to claim 1, further comprising:
first conductive connection members formed between the connection pads and the anisotropic conductive fabric, and electrically connecting the connection pads and the conductive fibers of the anisotropic conductive fabric.

15. The semiconductor package according to claim 14, wherein the first conductive connection members comprise a solder.

16. The semiconductor package according to claim 1, wherein the bumps have substantially a wedge shape which is inserted into the anisotropic conductive fabric.

17. The semiconductor package according to claim 1, further comprising:
second conductive connection members formed between the bumps and the anisotropic conductive fabric, and electrically connecting the bumps and the conductive fibers of the anisotropic conductive fabric.

18. The semiconductor package according to claim 17, wherein the second conductive connection members comprise a solder.

19. The semiconductor package according to claim 1, further comprising:
protective layers formed on a top surface and a bottom surface of the anisotropic conductive fabric.

20. The semiconductor package according to claim 19, wherein the protective layers are formed of an insulative material.

21. The semiconductor package according to claim 19, wherein the protective layer formed on the bottom surface of the anisotropic conductive fabric includes an adhesion.

22. The semiconductor package according to claim 19, wherein the protective layers comprise an enamel-coated material.

23. The semiconductor package according to claim 1, further comprising:
an adhesive member between the anisotropic conductive fabric and the substrate.

24. A semiconductor package comprising:
a substrate formed with connection pads on one surface thereof;
an anisotropic conductive fabric including conductive fibers and insulative fibers, and attached to the connection pads and the one surface of the substrate such that at least one of the conductive fibers is electrically coupled to each connection pad of the substrate;
a semiconductor device including bumps, and bonded to the anisotropic conductive fabric by the medium of the bumps such that each bump is electrically connected to at least one conductive fiber at a position horizontally displaced from each connection pad; and
second conductive connection members impregnated into the anisotropic conductive fabric, and electrically connecting the bumps and the conductive fibers of the anisotropic conductive fabric.

* * * * *